(12) United States Patent
Greene et al.

(10) Patent No.: US 11,309,221 B2
(45) Date of Patent: Apr. 19, 2022

(54) SINGLE METALLIZATION SCHEME FOR GATE, SOURCE, AND DRAIN CONTACT INTEGRATION

(71) Applicant: International Business Machines Corporation, Armonk, NY (US)

(72) Inventors: Andrew Greene, Slingerlands, NY (US); Victor W. C. Chan, Guilderland, NY (US); Gangadhara Raja Muthinti, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 259 days.

(21) Appl. No.: 16/684,616

(22) Filed: Nov. 15, 2019

(65) Prior Publication Data

US 2020/0083117 A1 Mar. 12, 2020

Related U.S. Application Data

(62) Division of application No. 16/112,092, filed on Aug. 24, 2018, now Pat. No. 10,985,076.

(51) Int. Cl.
*H01L 23/00* (2006.01)
*H01L 21/8238* (2006.01)
(Continued)

(52) U.S. Cl.
CPC ............ *H01L 21/823871* (2013.01); *H01L 21/28247* (2013.01); *H01L 21/76819* (2013.01);
(Continued)

(58) Field of Classification Search
CPC ....... H01L 21/823871; H01L 21/28247; H01L 21/76819; H01L 21/76846; H01L 21/76865; H01L 21/823821; H01L 21/823842; H01L 23/5226; H01L 23/53266; H01L 27/0924
See application file for complete search history.

(56) References Cited

U.S. PATENT DOCUMENTS 6,261,950 B1 7/2001 Tobben et al.
6,828,214 B2 12/2004 Notsu et al.
(Continued)

OTHER PUBLICATIONS

Andrew Greene et al., "Single Metallization Scheme for Gate, Source, and Drain Contact Integration," U.S. Appl. No. 16/112,092, filed Aug. 24, 2018.
(Continued)

*Primary Examiner* — Mounir S Amer
*Assistant Examiner* — Alexander Belousov
(74) *Attorney, Agent, or Firm* — Cantor Colburn LLP; Samuel Waldbaum

(57) ABSTRACT

A technique relates to a semiconductor device. One or more N-type field effect transistor (NFET) gates and one or more P-type field effect transistor (PFET) gates are formed. Source and drain (S/D) contacts are formed, at least one material of the S/D contacts being formed in the PFET gates. Insulating material is deposited as self-aligned caps above the NFET gates and the PFET gates, while the insulating material is also formed as insulator portions adjacent to the S/D contacts. Middle of the line (MOL) contacts are formed above the S/D contacts.

20 Claims, 19 Drawing Sheets

(51) Int. Cl.
  *H01L 21/768* (2006.01)
  *H01L 23/532* (2006.01)
  *H01L 21/28* (2006.01)
  *H01L 27/092* (2006.01)
  *H01L 23/522* (2006.01)

(52) U.S. Cl.
  CPC .. *H01L 21/76846* (2013.01); *H01L 21/76865* (2013.01); *H01L 21/823821* (2013.01); *H01L 21/823842* (2013.01); *H01L 23/5226* (2013.01); *H01L 23/53266* (2013.01); *H01L 27/0924* (2013.01)

(56) References Cited

U.S. PATENT DOCUMENTS

| | | | |
|---|---|---|---|
| 7,217,603 B2 | 5/2007 | Currie et al. | |
| 7,407,875 B2 * | 8/2008 | Wong | H01L 21/76856 257/E21.548 |
| 8,159,038 B2 | 4/2012 | Hampp | |
| 9,741,609 B1 * | 8/2017 | Cheng | H01L 23/485 |
| 9,786,754 B1 | 10/2017 | Lee et al. | |
| 9,923,078 B2 | 3/2018 | Greene et al. | |
| 10,121,702 B1 | 11/2018 | Park et al. | |
| 10,153,203 B2 | 12/2018 | Wang et al. | |
| 10,269,654 B1 | 4/2019 | Gao et al. | |
| 10,319,627 B2 | 6/2019 | Park et al. | |
| 10,325,819 B1 * | 6/2019 | Gao | H01L 21/823878 |
| 10,453,688 B2 | 10/2019 | Chien et al. | |
| 2007/0141798 A1 * | 6/2007 | Bohr | H01L 29/78 438/301 |
| 2008/0076216 A1 | 3/2008 | Pae et al. | |
| 2015/0137195 A1 | 5/2015 | Lin et al. | |
| 2017/0077256 A1 | 3/2017 | Adusumilli et al. | |
| 2017/0358585 A1 | 12/2017 | Lim et al. | |
| 2018/0061642 A1 | 3/2018 | Chien et al. | |
| 2018/0151429 A1 | 5/2018 | Wang et al. | |
| 2018/0166319 A1 | 6/2018 | Park et al. | |

OTHER PUBLICATIONS

List of IBM Patents or Patent Applications Treated as Related; (Appendix P); Date Filed Nov. 15, 2019, 2 pages.

* cited by examiner

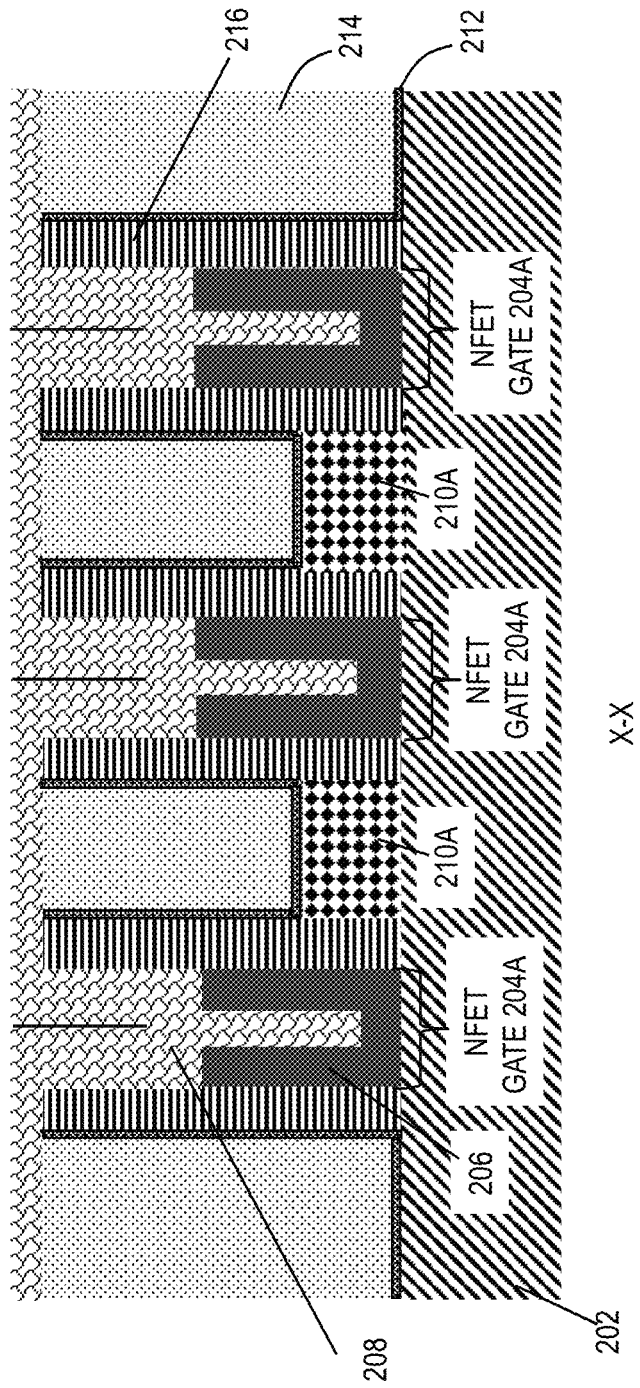

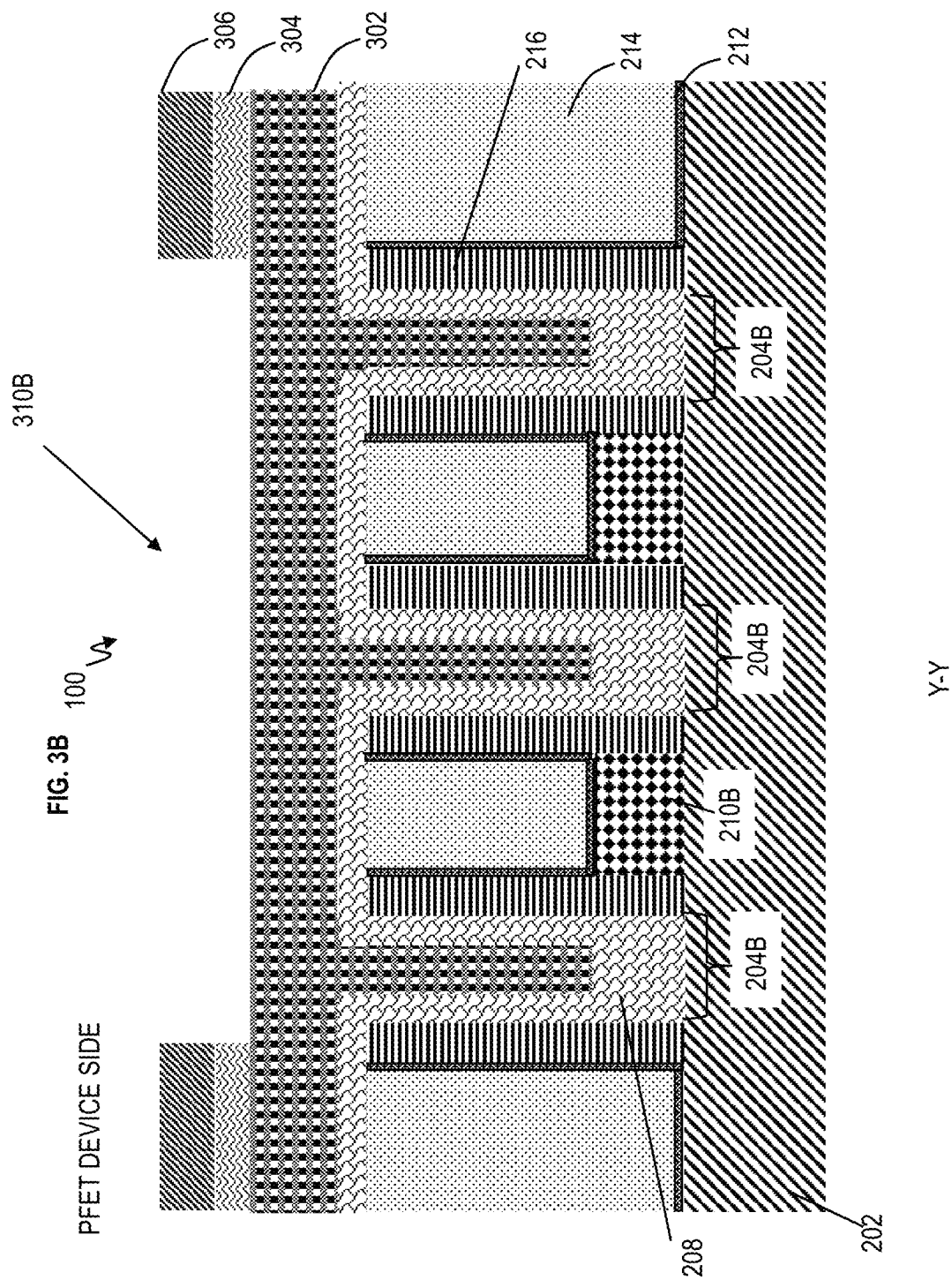

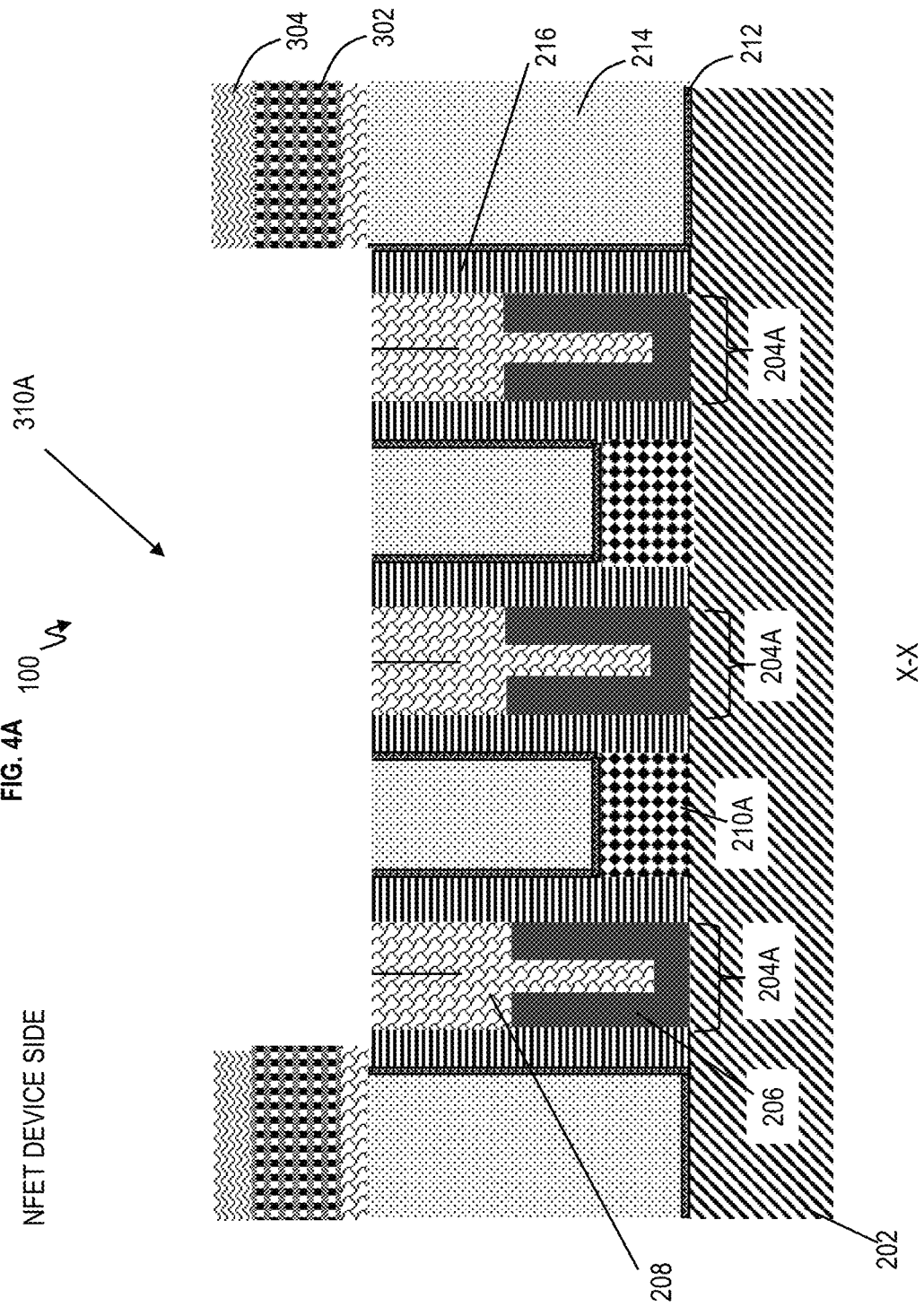

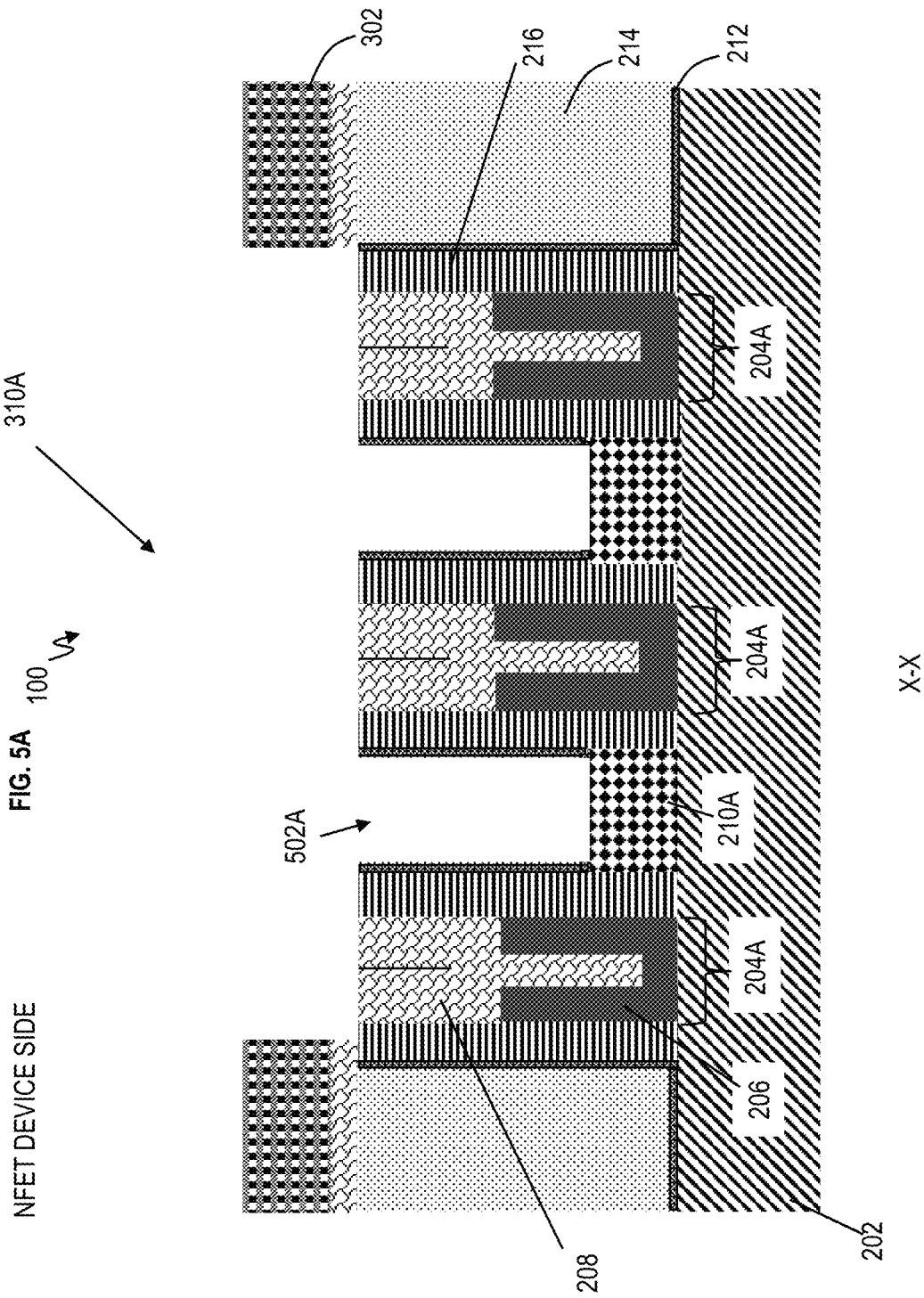

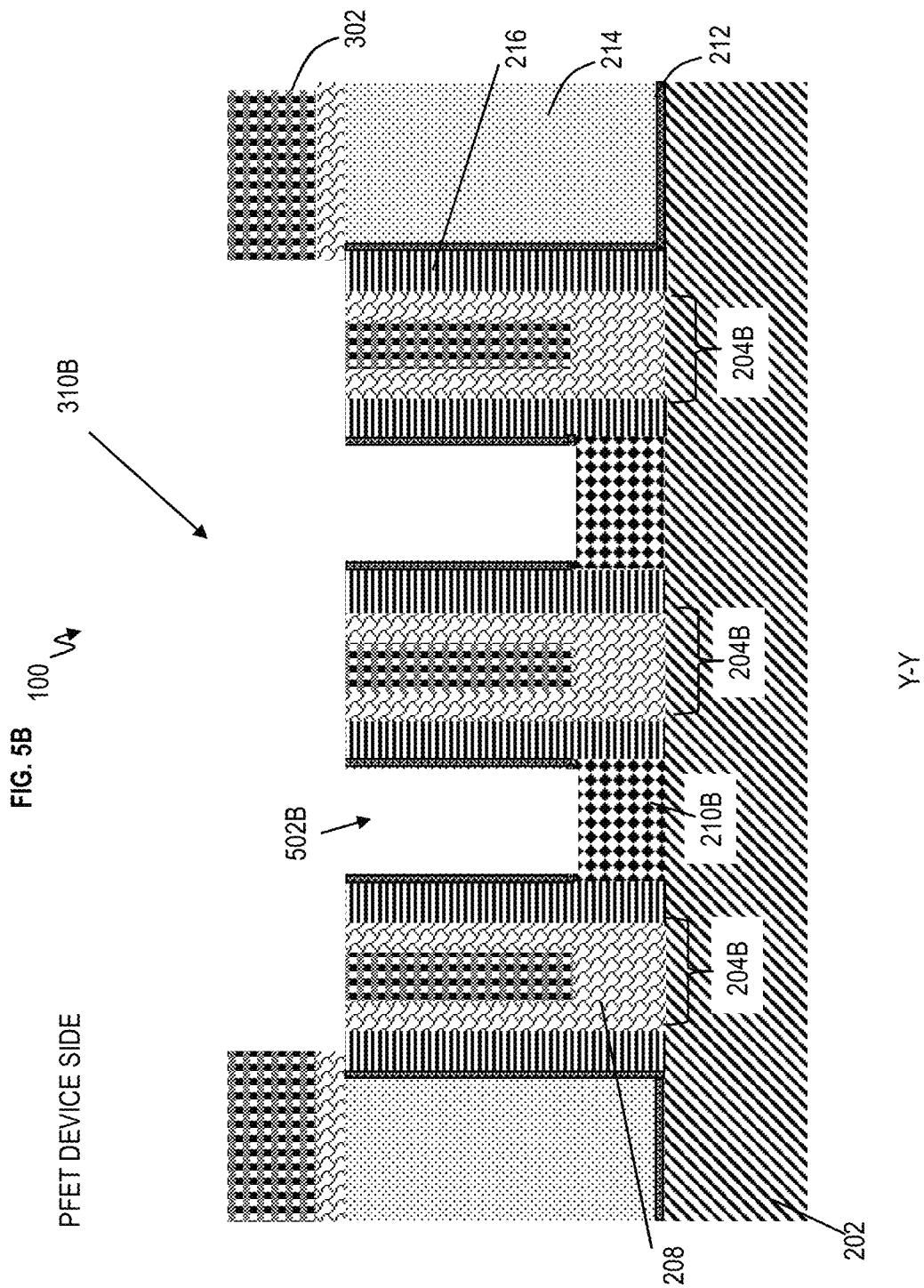

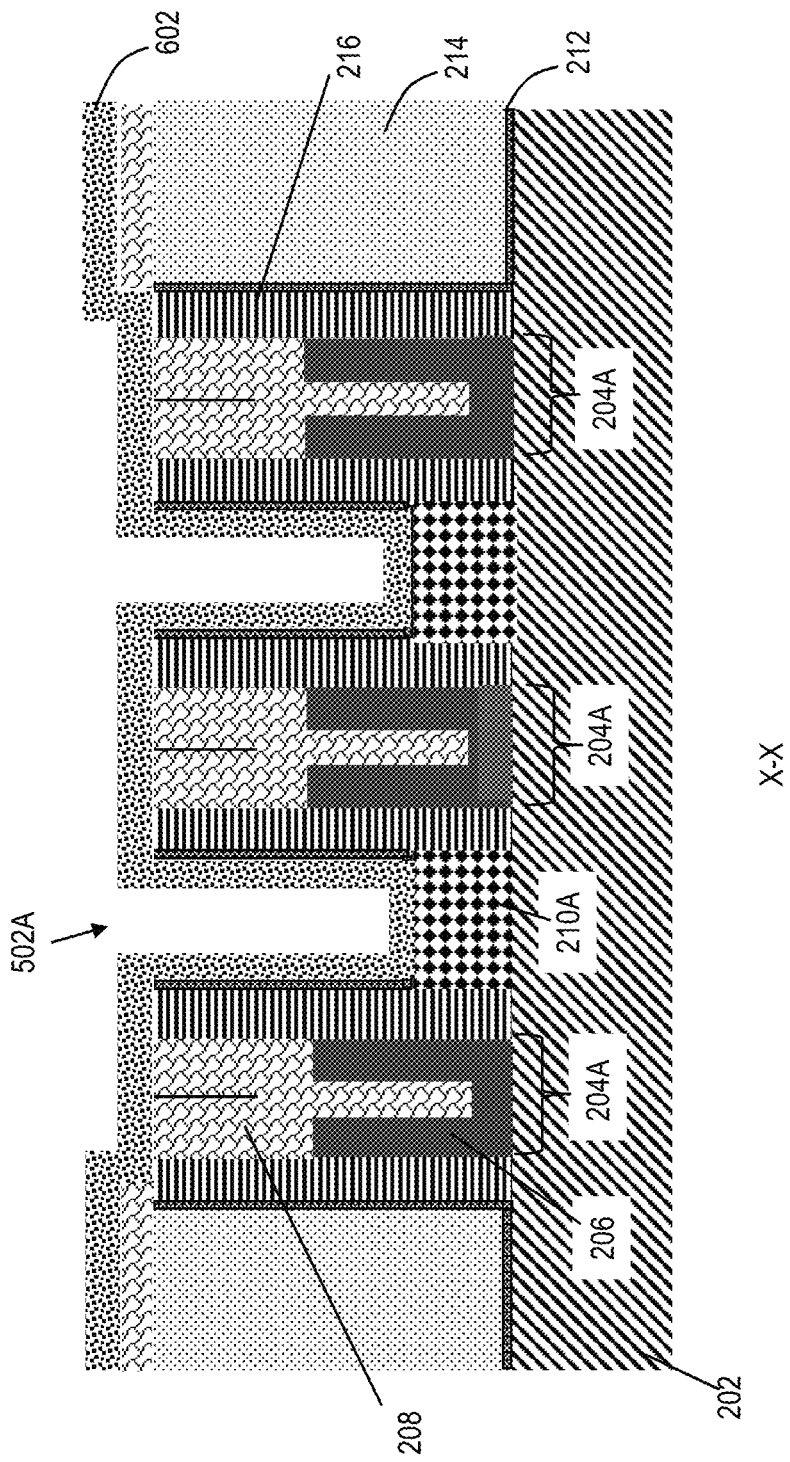

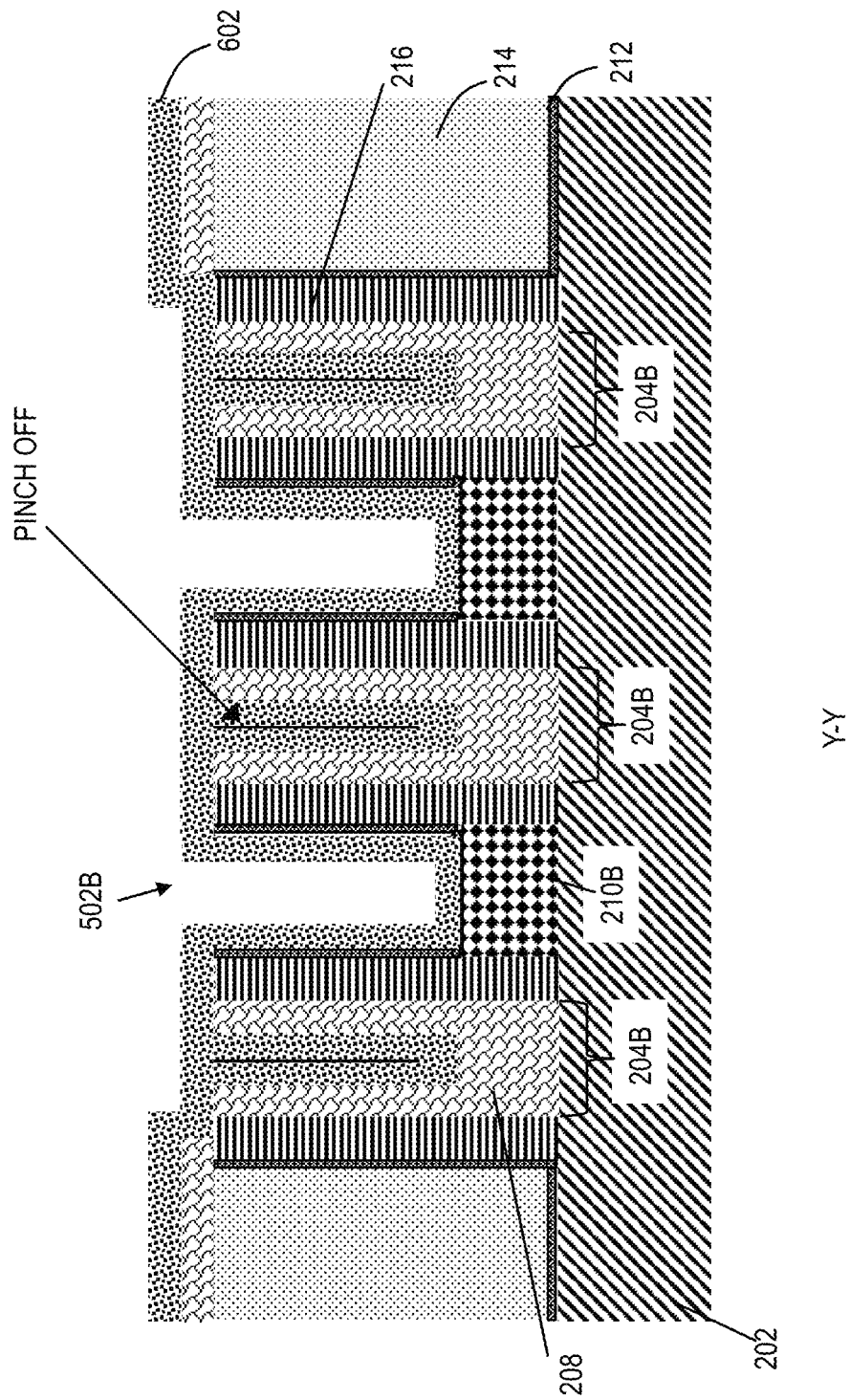

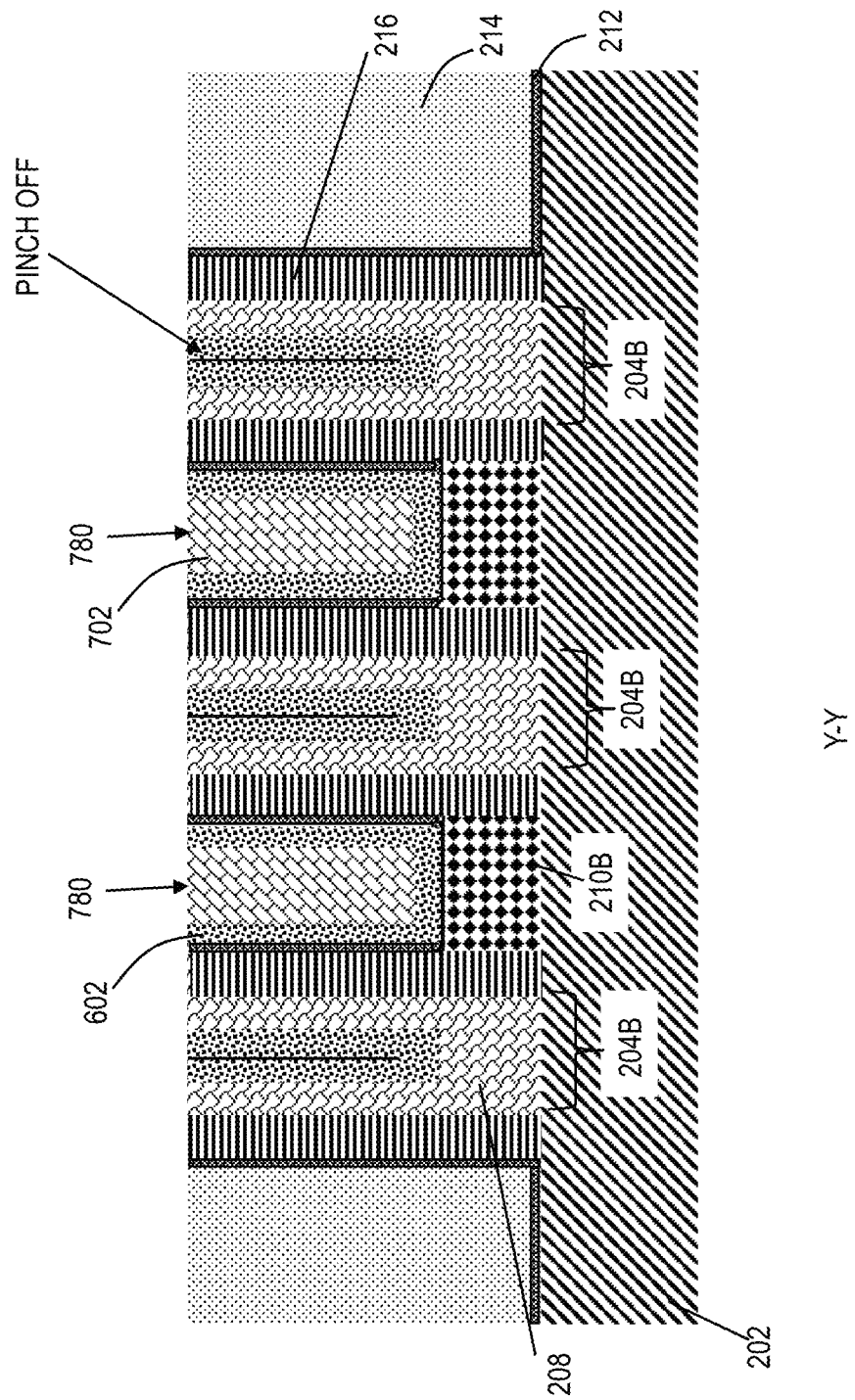

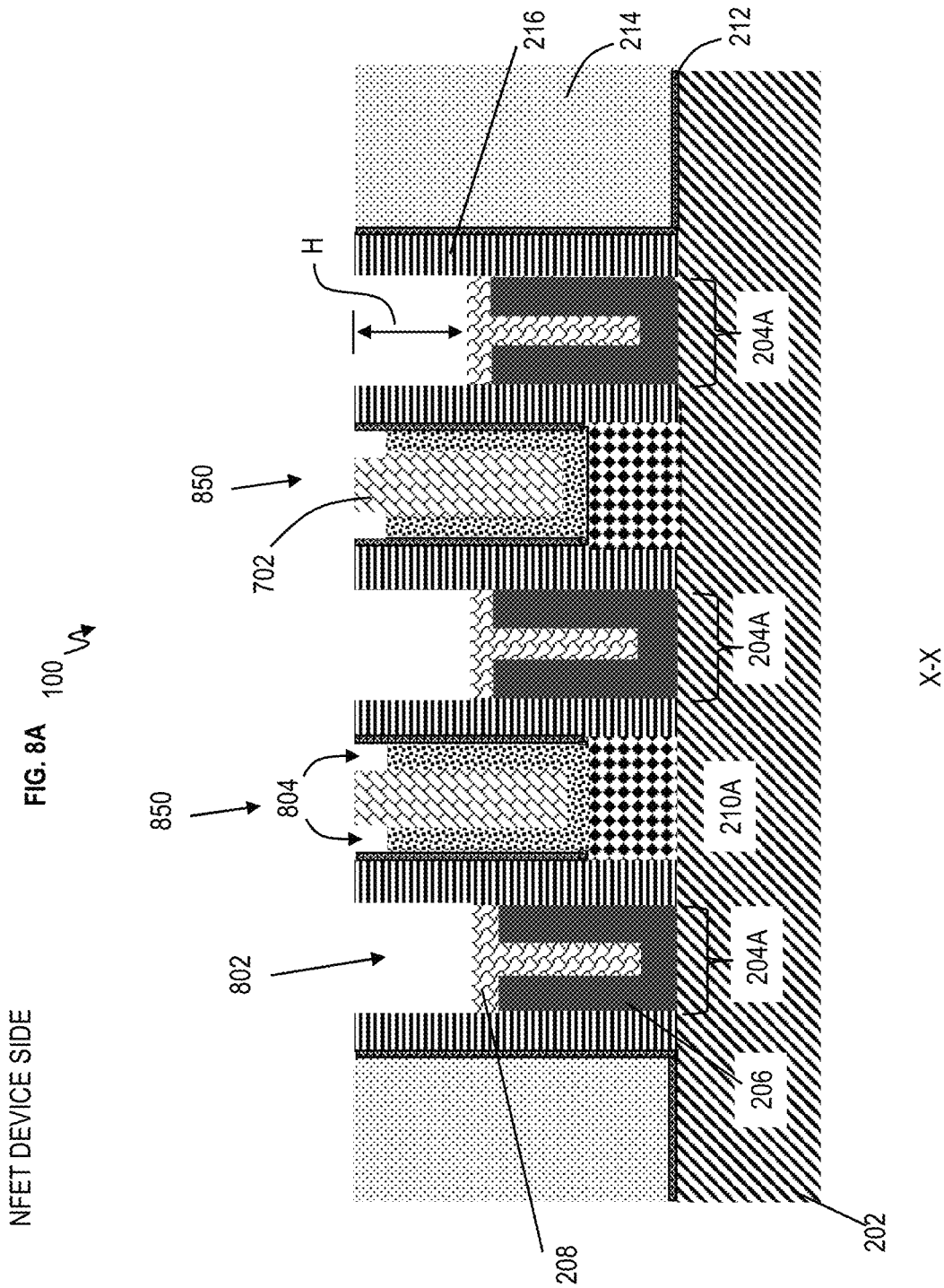

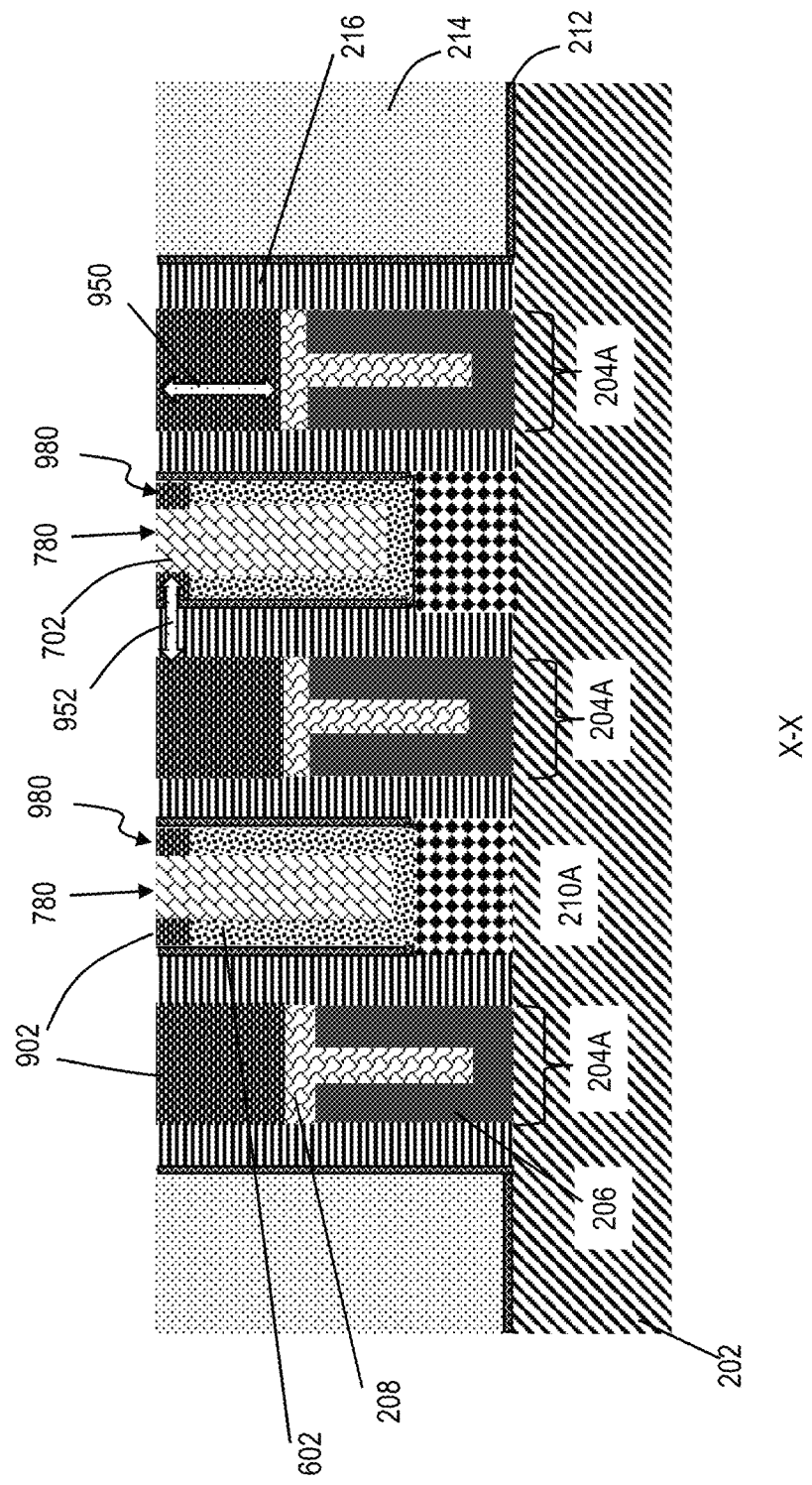

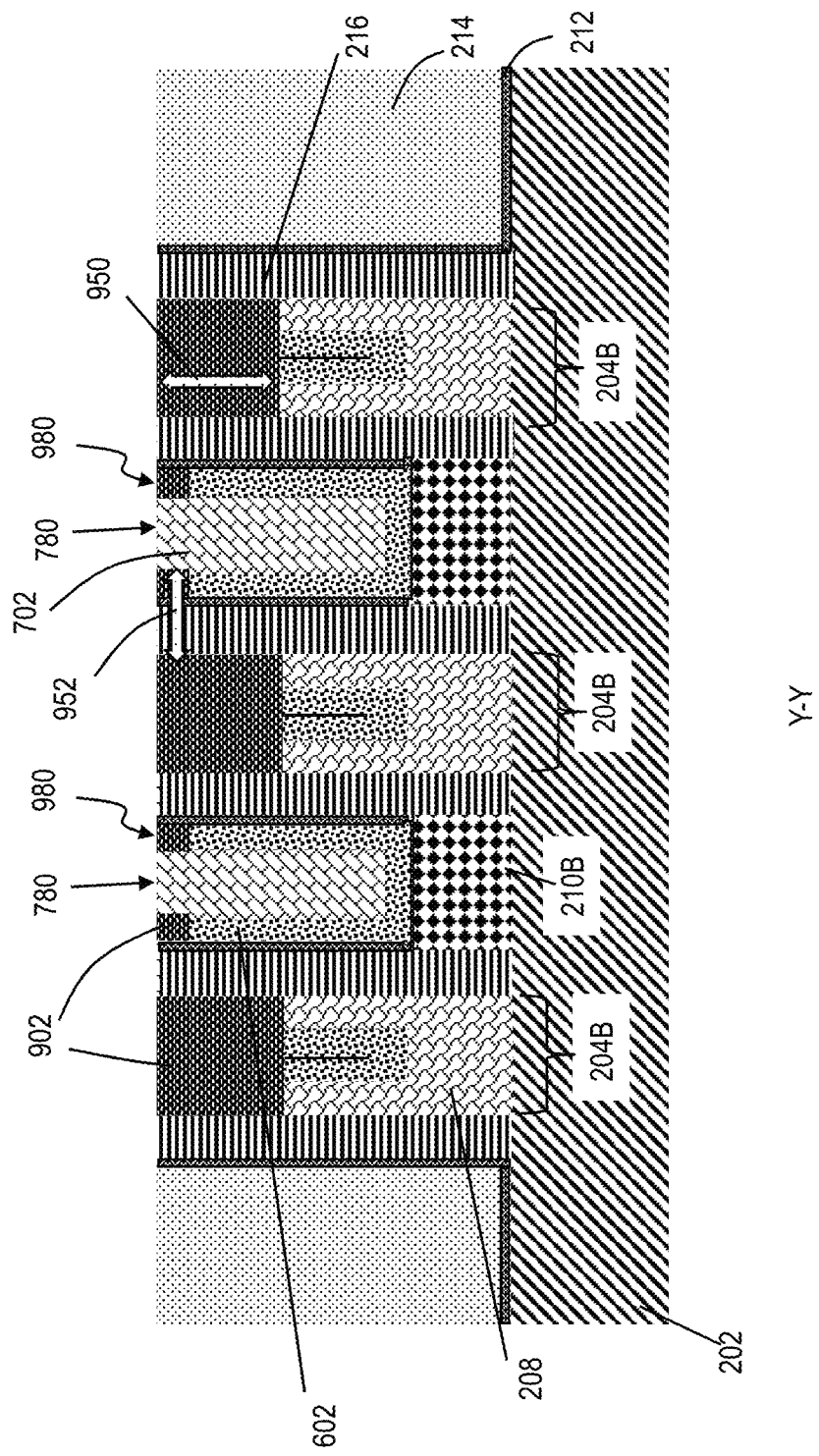

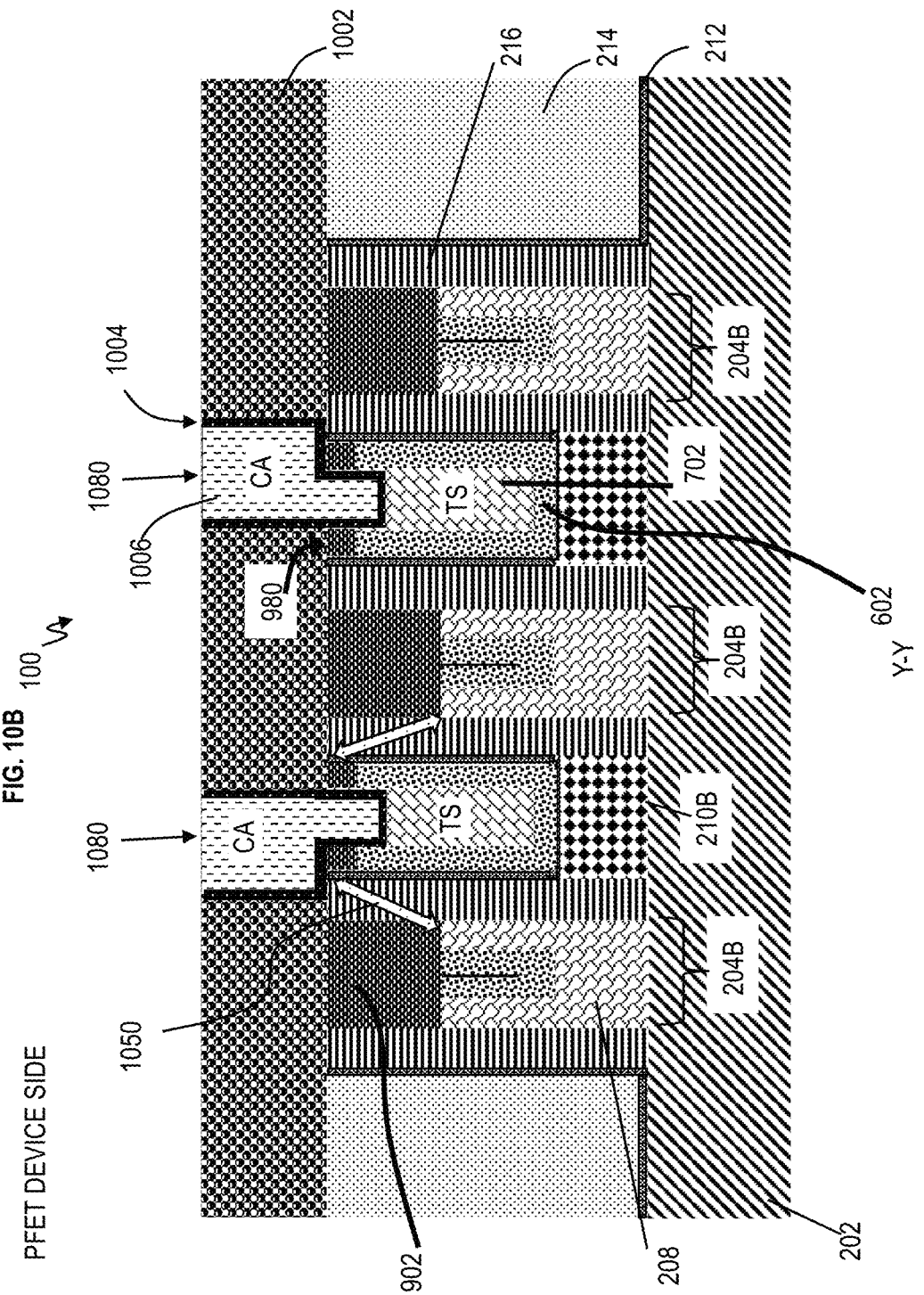

SINGLE METALLIZATION SCHEME FOR GATE, SOURCE, AND DRAIN CONTACT INTEGRATION

DOMESTIC PRIORITY

This application is a divisional of U.S. patent application Ser. No. 16/112,092, filed Aug. 24, 2018, the disclosure of which is incorporated by reference herein in its entirety.

BACKGROUND

The present invention generally relates to fabrication methods and resulting structures for semiconductor devices, and more specifically, to a single metallization scheme for gate, source, and drain contact integration.

A metal-oxide-semiconductor field-effect transistors (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions.

SUMMARY

Embodiments of the invention are directed to a method for forming a semiconductor device. A non-limiting example of the method includes forming one or more N-type field effect transistor (NFET) gates and one or more P-type field effect transistor (PFET) gates, and forming source and drain (S/D) contacts, at least one material of the S/D contacts being formed in the PFET gates. Also, the method includes depositing insulating material as self-aligned caps above the NFET gates and the PFET gates, while the insulating material is also formed as insulator portions adjacent to the S/D contacts and forming middle of the line (MOL) contacts above the S/D contacts.

Embodiments of the invention are directed to a semiconductor device. A non-limiting example of the semiconductor device includes one or more N-type field effect transistor (NFET) gates and one or more P-type field effect transistor (PFET) gates, and source and drain (S/D) contacts, at least one material of the S/D contacts being formed in the PFET gates. Also, the semiconductor device includes insulating material formed as self-aligned caps above the NFET gates and the PFET gates, where the insulating material is also formed as insulator portions adjacent to the S/D contacts, and middle of the line (MOL) contacts formed above the S/D contacts.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a cross-sectional view of the semiconductor device taken along line X-X in FIG. 1 after an initial set of fabrication operations according to embodiments of the invention;

FIG. 3B depicts a cross-sectional view of the semiconductor device taken along line Y-Y after fabrication operations according to embodiments of the invention;

FIG. 4A depicts a cross-sectional view of the semiconductor device taken along line X-X after fabrication operations according to embodiments of the invention;

FIG. 5A depicts a cross-sectional view of the semiconductor device taken along line X-X in FIG. 1 after fabrication operations according to embodiments of the invention;

FIG. 5B depicts a cross-sectional view of the semiconductor device taken along line Y-Y after fabrication operations according to embodiments of the invention;

FIG. 6A depicts a cross-sectional view of the semiconductor device taken along line X-X in FIG. 1 after fabrication operations according to embodiments of the invention;

FIG. 6B depicts a cross-sectional view of the semiconductor device taken along line Y-Y after fabrication operations according to embodiments of the invention;

FIG. 7B depicts a cross-sectional view of the semiconductor device taken along line Y-Y after fabrication operations according to embodiments of the invention;

FIG. 8A depicts a cross-sectional view of the semiconductor device taken along line X-X after fabrication operations according to embodiments of the invention;

FIG. 9A depicts a cross-sectional view of the semiconductor device taken along line X-X after fabrication operations according to embodiments of the invention;

FIG. 9B depicts a cross-sectional view of the semiconductor device taken along line Y-Y after fabrication operations according to embodiments of the invention;

FIG. 10B depicts a cross-sectional view of the semiconductor device taken along line Y-Y after fabrication operations according to embodiments of the invention.

Figure 1:
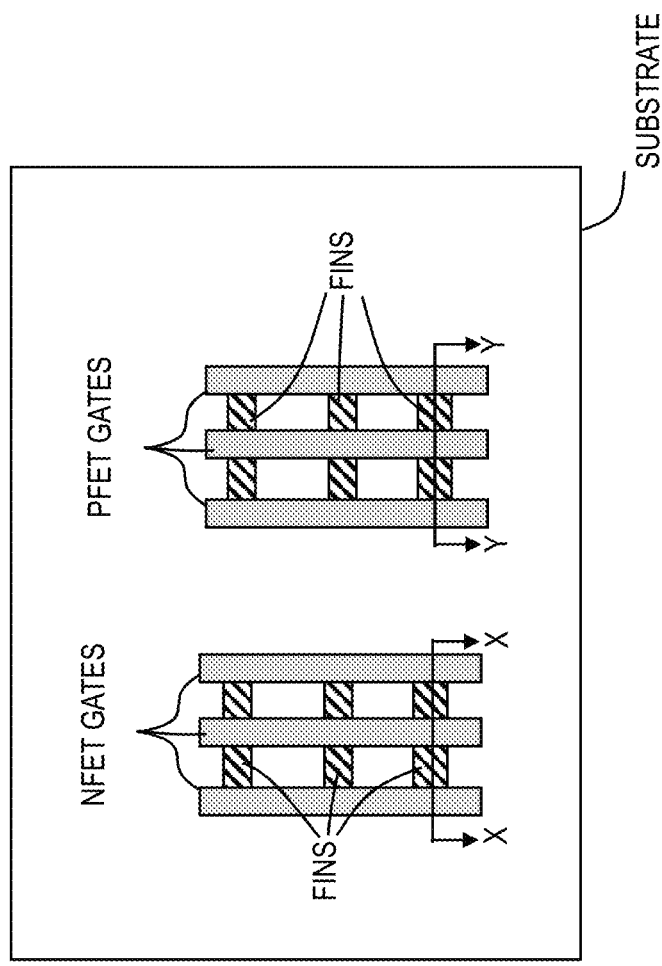
FIG. 1 depicts a simple diagram of a top view of a semiconductor device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, the self-aligned contact (SAC) cap is utilized to protect the gate (also referred to as the PC) from shorts in transistors. The SAC cap thickness is important to prevent middle of line (MOL) contact (also referred to as CA) to gate shorts. MOL to gate shorts, or CA to PC shorts, are one of the top yield destroyers in transistor fabrication. Multiple (metal) chemical mechanical planarization/polishing (CMP) steps for the replacement metal gate (RMG) formation and MOL formation increase non-uniformity and reduce budget (i.e., space) available for the formation of the SAC cap. Two or more metal CMP can occur because of the tungsten (W) CMP, trench silicide (TS) CMP and W CMP which affect the SAC cap. Therefore, there is a minimal budget (i.e., space) to increase the SAC cap thickness, which results in the SAC cap being too thin and thereby causing CA to PC shorts.

Turning now to an overview of the aspects of the invention, one or more embodiments of the invention provide semiconductor devices and a method of forming the semiconductor devices. Embodiments of the invention provide methods and structures which merge two metal CMPs to one metal CMP in order to reduce approximately 10-15 nm SAC cap loss and improve gate height uniformity, thereby preventing CA to PC shorts. This can be accomplished by moving SAC cap formation after the TS process (i.e., after the source/drain contact process), which decouples gate metal recess from TS top. This process also offsets (i.e., increases) the replacement metal gate (RMG) metal top and CA-TS boundary (with more insulator between the metals), significantly reducing CA to PC shorts. In one or more embodiments of the invention, this process has no W in nominal gates, enabling selective etch/RIE between gate and S/D regions (SAC cap and TS cap), which can enable CBoA integration (where CB refers to gate contact and CBoA means gate contact over active region).

Figure 2B:
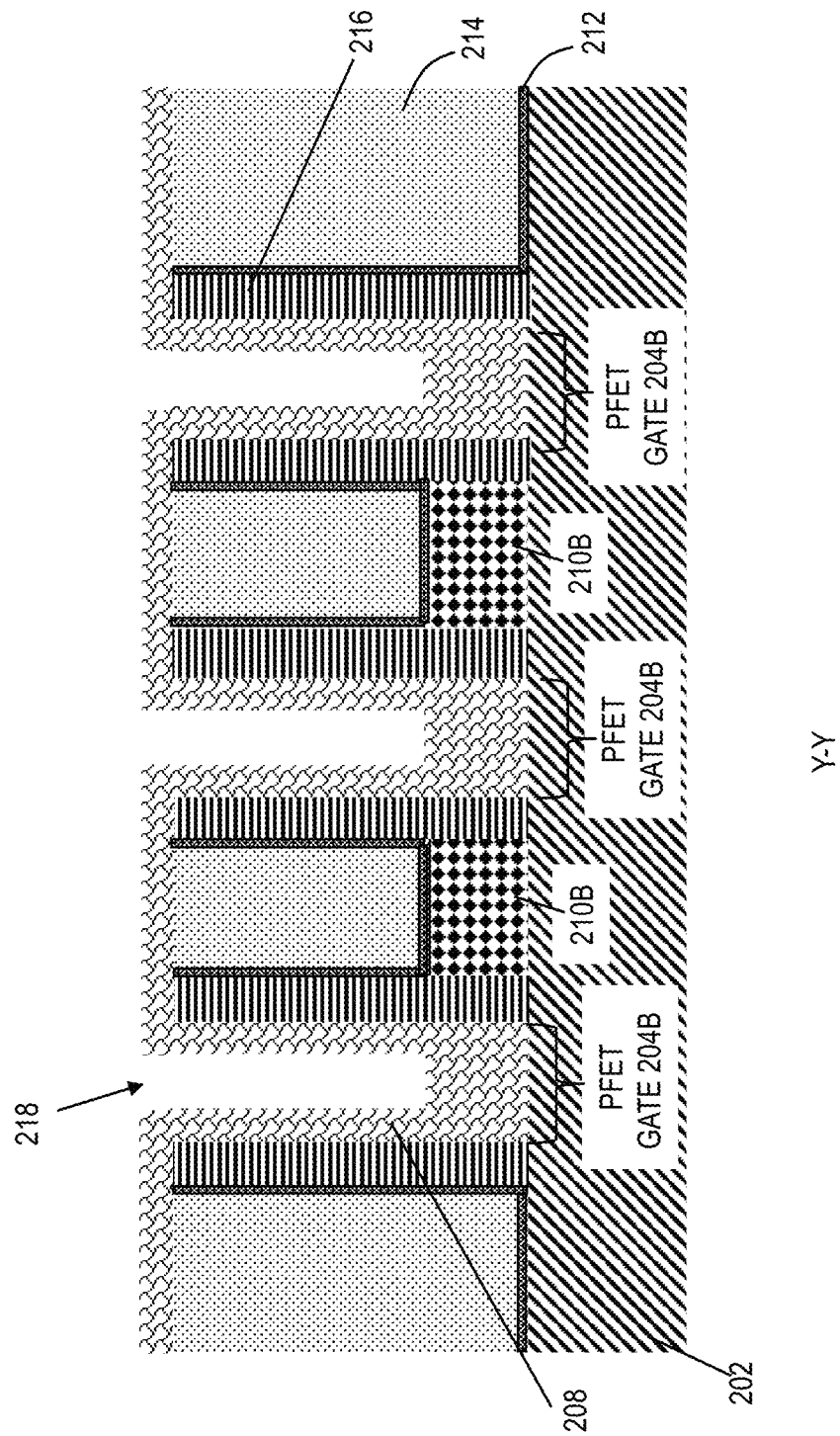
FIG. 2B depicts a cross-sectional view of the semiconductor device taken along line Y-Y in FIG. 1 after an initial set of fabrication operations according to embodiments of the invention.

Turning now to a more detailed description of aspects of the present invention, FIG. 1 depicts a simple diagram of a top view of a semiconductor device 100 according to embodiments of the invention. For simplicity and ease of understanding, FIG. 1 omits some layers (elements) so as not to obscure the figure. FIG. 2A depicts a cross-sectional view of the semiconductor device 100 shown in FIG. 1 taken along line X-X according to embodiments of the invention. FIG. 2B depicts a cross-sectional view of the semiconductor device 100 shown in FIG. 1 taken along line Y-Y according to embodiments of the invention. FIG. 2A illustrates the NFET device side and FIG. 2B illustrates the PFET device side of the semiconductor device 100.

After initial fabrication processing, the semiconductor device 100 includes fins 202 with NFET epitaxial regions 210A and PFET epitaxial regions 210B formed on the fins 202 in FIGS. 2A and 2B, respectively. The fins 202 are formed of semiconductor material. The fins 202 can be a silicon substrate, although other materials can be used as the fins 202. The NFET epitaxial regions 210A and PFET epitaxial regions 210B can be referred to as source or drain (S/D) regions. The NFET epitaxial regions 210A and PFET epitaxial regions 210B (i.e., source/drain regions) can be epitaxially grown from the fins 202 and are semiconductor material. The NFET epitaxial regions 210A can be doped with N-type dopants and PFET epitaxial regions 210B can be doped with P-type dopants as desired. A contact etch stop layer (CESL) 212 is formed on sides of spacers 216, on top of the NFET epitaxial regions 210A and PFET epitaxial regions 210B, and on top of the fin 202, such that the CESL 212 lines the respective surfaces. The CESL 212 is a non-conductive material. The CESL 212 can be a nitride such as silicon nitride (SiN). Inter-level dielectric (ILD) material 214 is formed on top of the CESL 212. The ILD material 214 is a low-k dielectric material. The low-k dielectric material can be, for example, an oxide material such as silicon dioxide.

Three NFET gates 204A are illustrated in which the middle NFET gate 204A is the active gate having NFET epitaxial regions 210A on both sides, as depicted in FIG. 2A. Similarly, three PFET gates 204B are illustrated in the middle PFET gate 204B is the active gate having PFET epitaxial regions 210B on both sides, as depicted in FIG. 2B. It should be appreciated that more or fewer gates 204A and 204B can be utilized. Although not shown so as not to obscure the figures, the channel region (in which current flows) is located under the respective gate regions 204A and 204B, which connects the one S/D epitaxial region 210A to the other S/D epitaxial region 210A and likewise connects one S/D epitaxial regions 210B to the other S/D epitaxial regions 210B. This method is applicable to both FinFET and nanosheet FET (hidden by the gate).

On the NFET device side for the NFET gates 204A in FIG. 2A, the NFET work function metal 206 is formed over the fin 202. One or more high-k dielectric materials (not shown) can be formed between the NFET work function metal 206 and the fin 202. Etching is performed to lower the NFET work function metal 206 in the NFET gates 204A. A PFET work function metal 208 is formed over the NFET work function metal 206. The PFET work function metal 208 is pinched off. Example NFET work function metals can include TiN, TiC, TiAlN, etc. Example PFET work function metals can include TiN and others. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum. High-k dielectric materials can have a dielectric constant greater than 3.9, 7.0, or 10.0.

On the PFET device side for the PFET gates 204B in FIG. 2B, the PFET work function metal 208 is formed over the fin 202. One or more high-k dielectric materials (not shown) can be formed between the PFET work function metal 208 and the fin 202. The NFET work function metal 206 was previously deposited in the PFET gates 204B but is removed from the PFET gate 204B prior to forming the PFET work function metal 208 in the PFET gate 204B. An opening 218 remains in the PFET gate 204B after depositing the PFET work function metal 208.

Sidewall spacers 216 (or gate spacers) are formed on sides of the NFET gates 204A and PFET gates 204B. Material of the sidewall spacers 216 is a low-k dielectric material. The low-k dielectric material can include an oxide such as silicon dioxide, a nitride such as silicon nitride, etc. The ILD material 214 not formed over the NFET epitaxial regions 210A and PFET epitaxial regions 210B is referred to as the "field" or field oxide.

Figure 3A:
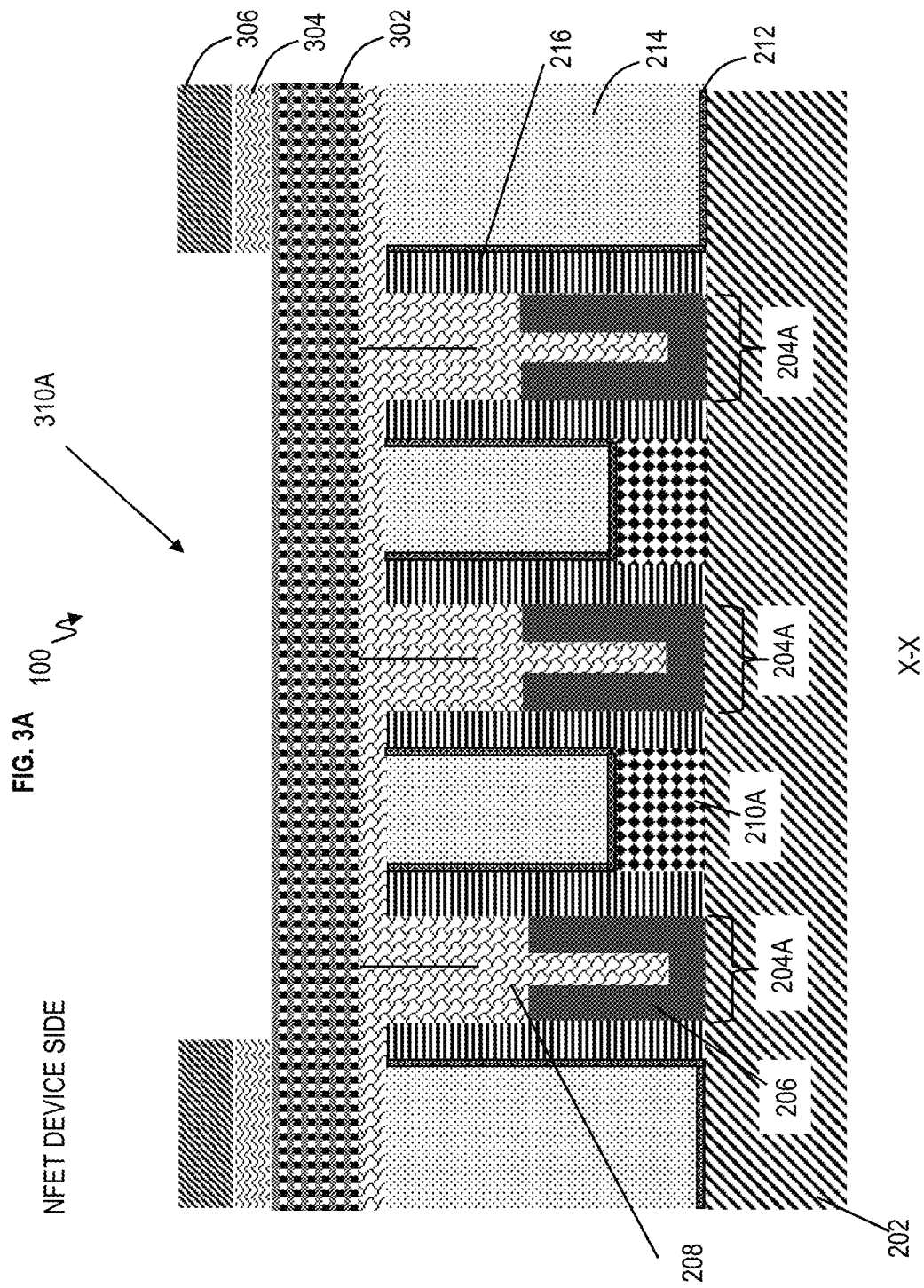
FIG. 3A depicts a cross-sectional view of the semiconductor device taken along line X-X after fabrication operations according to embodiments of the invention.

FIG. 3A depicts a cross-sectional view of the semiconductor device 100 taken along line X-X after fabrication operations according to embodiments of the invention. FIG. 3B depicts a cross-sectional view of the semiconductor device 100 taken along line Y-Y after fabrication operations according to embodiments of the invention.

FIGS. 3A and 3B illustrate a block mask 302 formed on the PFET work function metal 208 of the semiconductor device 100. The block mask 302 can be an organic planarization layer (OPL), an organic dielectric layer (ODL), etc. In the PFET device side in FIG. 3B, the block mask 302 is formed in the openings 218 (depicted in FIG. 2B). Antireflective coating (ARC) layer 304 is formed on top of the block mask 302, and a resist layer 306 is formed on top of the ARC layer 304. The ARC layer 304 can be organic or inorganic depending on the desired method of removal. The resist layer 306 can be a photoresist material, which can be a positive resist material or negative resist material. Lithography is performed to pattern opening 310A over the NFET gates 204A in FIG. 3A and pattern opening 310B over the PFET gates 204B in FIG. 3B. The openings 310A and 310B are in preparation for forming the trench silicide.

Figure 4B:
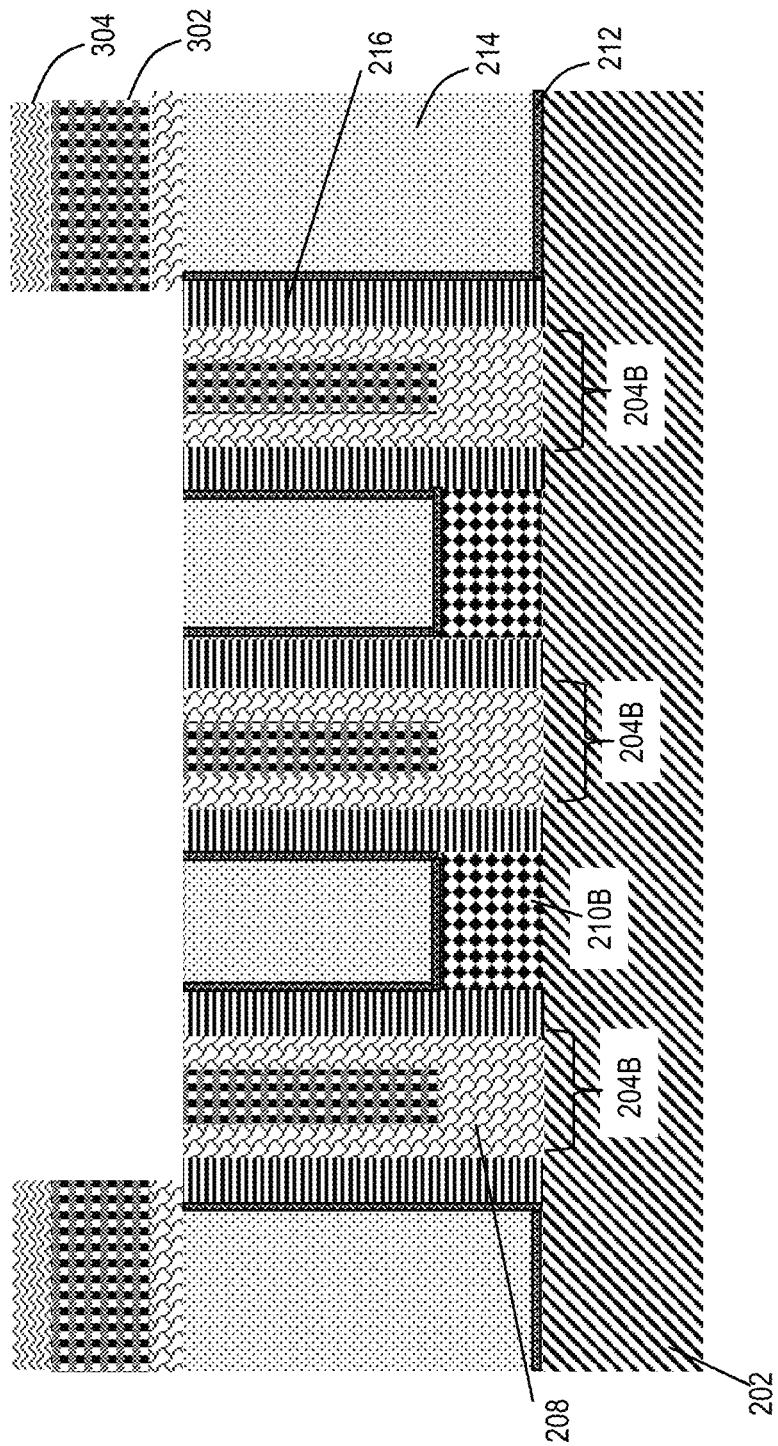
FIG. 4B depicts a cross-sectional view of the semiconductor device taken along line Y-Y after fabrication operations according to embodiments of the invention.

FIG. 4A depicts a cross-sectional view of the semiconductor device 100 taken along line X-X after fabrication operations according to embodiments of the invention. FIG. 4B depicts a cross-sectional view of the semiconductor device 100 taken along line Y-Y after fabrication operations according to embodiments of the invention. Lithography is performed to further etch the openings 310A and 310B through the block mask 302. The openings 310A and 310B now expose the ILD material 214 above the NFET epitaxial material 210A and the PFET epitaxial material 210B, in preparation for exposed ILD material 214.

FIG. 5A depicts a cross-sectional view of the semiconductor device 100 taken along line X-X after fabrication operations according to embodiments of the invention. FIG. 5B depicts a cross-sectional view of the semiconductor device 100 taken along line Y-Y after fabrication operations according to embodiments of the invention. Etching is performed in preparation for the trench silicide. For example, reactive ion etching can be performed to remove the exposed ILD material 214 over the NFET epitaxial material 210A and the PFET epitaxial material 210B, thereby creating openings 502A in FIG. 5A and openings 502B in FIG. 5B. For example, the ILD material 214 (e.g., $SiO_2$) can be pulled down to the CESL 212, and (subsequently) the bottom CESL 212 is removed from the tops of the NFET epitaxial material 210A and the PFET epitaxial material 210B. Etching (e.g., a directional etch) can be performed to selectively remove the CESL 212 at the bottom of the openings 502A and 502B. The CESL 212 remains on the sidewalls of the spacers 216 in openings 502A and 502B. Accordingly, top surfaces of the NFET epitaxial material 210A are exposed in openings 502A and similarly top surfaces of the PFET epitaxial material 210B are exposed in openings 502B. Additionally, the ARC layer 304 is removed during the etching.

FIG. 6A depicts a cross-sectional view of the semiconductor device 100 taken along line X-X after fabrication operations according to embodiments of the invention. FIG. 6B depicts a cross-sectional view of the semiconductor device 100 taken along line Y-Y after fabrication operations according to embodiments of the invention. The block mask 302 is removed, for example, using an OPL or ODL ash. Also, the etching removes the block mask 302 in the PFET gates 204B. After removal of the block mask 302, a source/drain contact liner 602 is deposited in FIGS. 6A and 6B. A pre-clean can be performed before depositing the source/drain contact liner 602. Particularly, the source/drain contact liner 602 is formed in the openings 502A and 502B in formation of the trench silicide.

The source/drain contact liner 602 can include one or more layers. The source/drain contact liner 602 can be a Ti/TiN stack in which the titanium (Ti) is deposited first and titanium nitride (TiN) second. In some embodiments of the invention, cobalt (Co) be utilized in place of the TiN. In some embodiments of the invention, Co can be deposited between depositing Ti and TiN, such that the source/drain contact liner 602 includes Ti/Co/TiN in a stack.

The source/drain contact liner 602 is pinched off in the PFET gates 204B shown in FIG. 6B. As an example to facilitate pinch off, the PFET work function metal 208 can be about 40 Å-50 Å, the Ti thickness can be about 40 Å-50 Å, the TiN thickness can be about 20 Å for a total thickness of about 20 nm on each side of the trench in the PFET gates 204B, thereby causing pinch off. If is a threshold voltage shift occurs in the PFET gates 204B due to the source/drain contact liner 602, modifications can be made to the work function metal stack which is the PFET work function metal 208 and the source/drain contact liner 602. The work function metal stack can be modified, and this modification can include changing the thickness, changing TiN/TiC/TiN ratio, adding a well/halo/external implant, etc., to bring the threshold voltage of the PFET gates 204B back to the desired value. It is noted the source/drain contact liner 602 is not deposited in the NFET gate 204A because the NFET gate 204A was previously pinched off by the PFET work function metal 208.

Figure 7A:
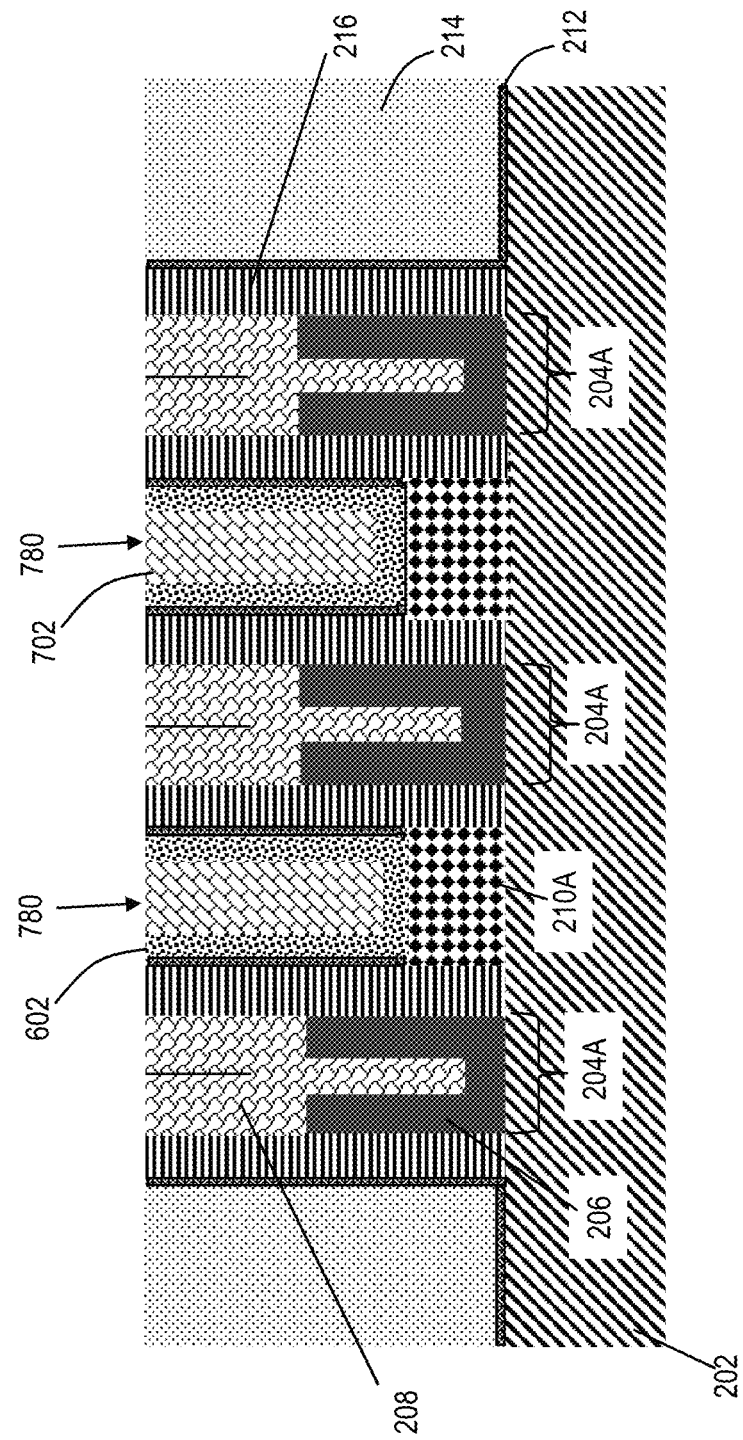
FIG. 7A depicts a cross-sectional view of the semiconductor device taken along line X-X after fabrication operations according to embodiments of the invention.

FIG. 7A depicts a cross-sectional view of the semiconductor device 100 taken along line X-X after fabrication operations according to embodiments of the invention. FIG. 7B depicts a cross-sectional view of the semiconductor device 100 taken along line Y-Y after fabrication operations according to embodiments of the invention.

Source/drain metal 702 is deposited on top of the source/drain contact liner 602 so as to fill the openings 502A and 502B. Examples of the source/drain metal 702 can include tungsten (W), cobalt (Co), etc. Metal chemical mechanical planarization/polishing of the source/drain metal 702 is performed to stop on the source/drain contact liner 602 (i.e., metal liner). This single metal CMP removes the gate W CMP requirement and thus only having one "metal" CMP improves uniformity of the ILD/gate height. Metal CMP involves polishing the S/D metal (W), with stop on the metal liner (TiN). Further, touch up CMP (over polish) can be performed to stop on dielectric (not shown in the figure).

Portions of the source/drain contact liner 602 merge or combine with the epitaxial layers 210A and 210B below to form a silicide. The source/drain metal 702 alone or combination with the source/drain contact liner 602 can sometimes be referred to as the trench silicide (TS) (or source/drain contact) 780. The source/drain contact 780 is formed on top of the NFET epitaxial material 210A and PFET epitaxial material 210B, so as to provide electrical contact.

Figure 8B:
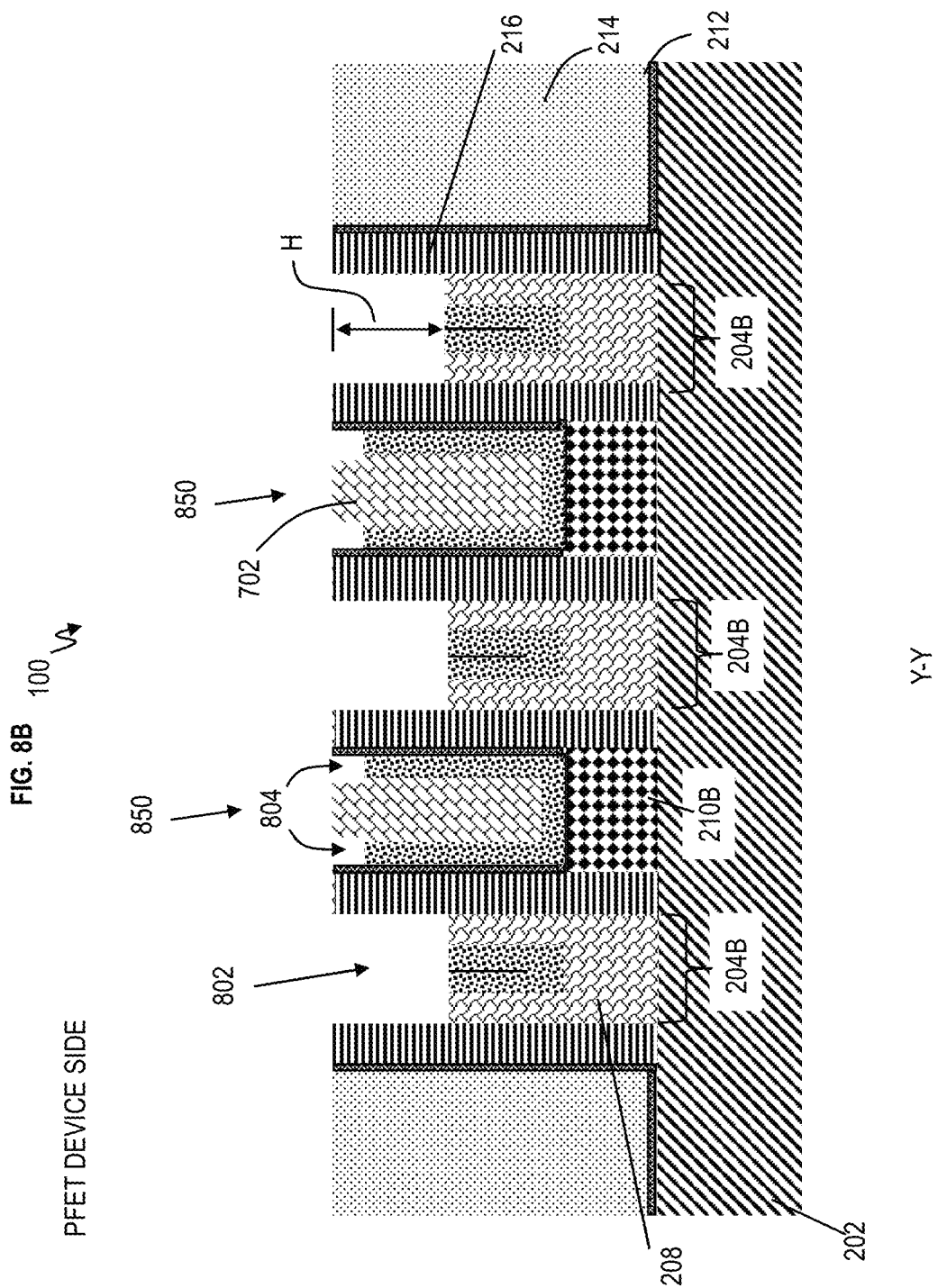
FIG. 8B depicts a cross-sectional view of the semiconductor device taken along line Y-Y after fabrication operations according to embodiments of the invention.

FIG. 8A depicts a cross-sectional view of the semiconductor device 100 taken along line X-X after fabrication operations according to embodiments of the invention. FIG. 8B depicts a cross-sectional view of the semiconductor device 100 taken along line Y-Y after fabrication operations according to embodiments of the invention.

The PFET work function metal 208 and source/drain contact liner 602 are recessed selective to the source/drain metal 702 (e.g., W or Co) to form cavities 802 and 804 which are to be filled with SAC cap material. This etching allows for significant gate metal top to CA-TS (W) contact boundary offset which minimizes leakage and prevents CA-gate shorting, thereby providing more insulator protection. As noted above, the source/drain metal 702 alone or combination with the source/drain contact liner 602 can be referred to as the TS or source/drain contact 780. The CA is the middle of the line (MOL) contact 1080, and the MOL contacts 1080 include the MOL contact metal 1006 combined with MOL contact liner 1004 depicted in FIGS. 10A and 10B.

The source/drain contact liner 602 (e.g., Ti/TiN liner) in source/drain regions 850 can be slightly recessed (i.e., recessed much less than gate) due to RIE lag. The cavities 804 in the source/drain regions 850 will be filled with (e.g., SiN) SAC cap material to provide a thicker "effective spacer" for contact offset.

Further, the cavities 802 have a taller height or greater depth (H) in the NFET gates 204A and PFET gates 204B than the state-of-the-art, because the gate height was not reduced during the previous metal CMP in FIGS. 7A and 7B. This allow for a thicker SAC cap of insulating material 902 depicted in FIGS. 9A, 9B, 10A, and 10B because of the deep recess of the cavities 802. The depth or height (H) of the cavities 802 can range from about 25 nm to 50 nm resulting in the same SAC cap height of insulating material 902.

FIG. 9A depicts a cross-sectional view of the semiconductor device 100 taken along line X-X after fabrication operations according to embodiments of the invention. FIG. 9B depicts a cross-sectional view of the semiconductor device 100 taken along line Y-Y after fabrication operations according to embodiments of the invention. Insulator material 902 is deposited to fill the cavities 802 and 804 and CMP is performed. This is not a metal CMP as understood by one skilled in the art. The insulator material 902 can be a nitride such as SiN. The arrow 950 shows the insulator material 902 fills (for a height H) a deep gate metal recess below the future CA to TS boundary. The arrow 952 shows an increase in (effective) spacer thickness (width from left-to-right or vice versa) because of the insulator material 902 filling the cavities 804 in the source/drain regions 850. The insulator material 902 formed in the cavities 804 is designated as insulator portions 980. The insulator material 902 formed on the NFET gates 204A and PFET gates 204B is referred to as the SAC cap, and the SAC cap is self-aligned to the respective gates below.

Figure 10A:
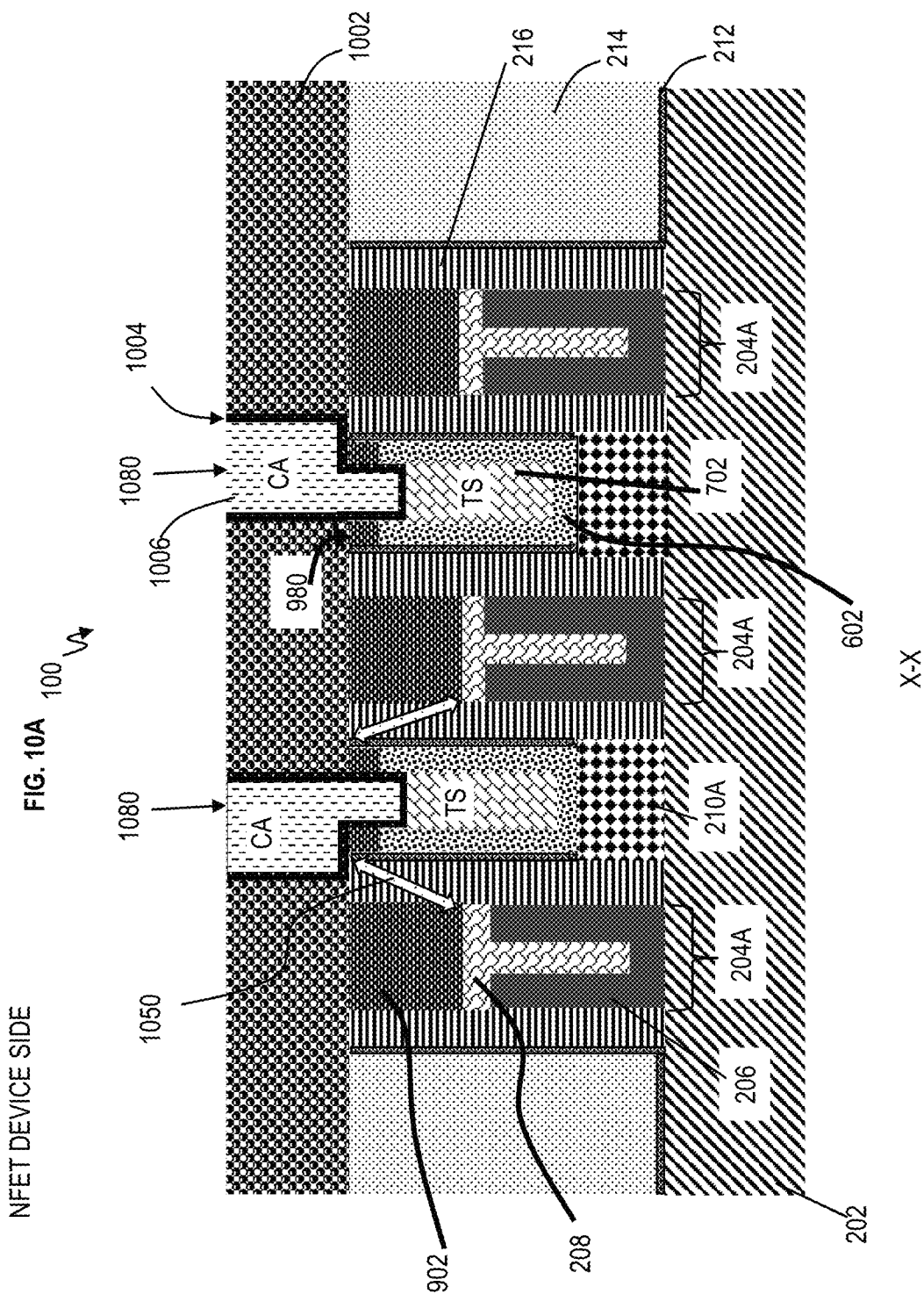
FIG. 10A depicts a cross-sectional view of the semiconductor device taken along line X-X after fabrication operations according to embodiments of the invention.

FIG. 10A depicts a cross-sectional view of the semiconductor device 100 taken along line X-X after fabrication operations according to embodiments of the invention. FIG. 10B depicts a cross-sectional view of the semiconductor device 100 taken along line Y-Y after fabrication operations according to embodiments of the invention. Middle of the line (MOL) inter-level layer (ILD) 1002 is deposited on top of the semiconductor device 100. The MOL ILD 1002 is a low-k dielectric material. The MOL ILD 1002 can be an oxide such as $SiO_2$, a nitride such as SiN, etc.

The MOL ILD 1002 can be patterned using, for example, using lithography into trenches (not shown). Etching such RIE can be used to form cavities in the MOL ILD 1002. The trenches are in preparation to form the MOL contacts 1080. MOL contact liner 1004 is deposited in the trenches, and the MOL contact metal 1006 is formed on top of the MOL contact liner 1004 so as to fill the trenches. CMP can be performed, and this CMP is not one that affects the height of the SAC cap material 902 above the NFET gates 204A and PFET gates 204B. The combination of the MOL contact liner 1004 and MOL contact metal 1006 form the MOL contacts 1080. The MOL contacts 1080 are in electrically connection with the source/drain metal 702 (e.g., the TS or source/drain contact 780). In some embodiments of the invention, the top surface of the source/drain metal 702 can be recessed below the top surface of the insulator portions 980, such that the MOL contacts 1080 extends down between the insulator portions 980. In some embodiments of the invention, the top surface of the source/drain metal 702 is not recessed and remains about level with the top surface of the insulator portions 980, and in that case, the bottom surface of the MOL contacts 1080 would be level with the top surfaces of the source/drain metal 702 and insulator portions 980.

Material of the MOL contact liner 1004 can include one or more layers and can include materials of the source/drain contact liner 602. The MOL contact liner 104 can be a Ti/TiN stack in which the titanium (Ti) is deposited first and titanium nitride (TiN) second. In some embodiments of the invention, cobalt (Co) be utilized in place of the TiN. In some embodiments of the invention, Co can be deposited between depositing Ti and TiN, such that the MOL contact liner 104 includes Ti/Co/TiN in a stack. Material of the MOL contact metal 1006 can include materials of the source/drain metal 702. The MOL contact metal 1006 can include tungsten (W), cobalt (Co), etc.

Arrows 1050 illustrate how embodiments of the invention provide additional process control in the SAC cap height and insulator between gate metal to CA.

According to embodiments of the invention, a method of forming a semiconductor device 100 is provided. The method includes forming one or more N-type field effect transistor (NFET) gates 204A and one or more P-type field effect transistor (PFET) gates 204B and forming source and drain (S/D) contacts 780, at least one material of the S/D contacts 780 being formed in the PFET gates 204B. The method includes depositing insulating material 902 as self-aligned caps above the NFET gates 204A and the PFET gates 204B, while the insulating material 902 is also formed as insulator portions 980 adjacent to the S/D contacts 780. The method includes forming middle of the line (MOL) contacts 1080 above the S/D contacts 780.

Also, the NFET gates 204A include at least one or more N-type work function metals 206 and at least one or more P-type work function metals 208. The PFET gates 204B include at least one or more P-type work function metals 208 along with the at least one material of the S/D contacts 780. The at least one material of the S/D contacts 780 is a S/D contact liner 602. The at least one material of the S/D contacts 780 include titanium. The at least one material of the S/D contacts 780 includes titanium along with a selection from the group consisting of titanium nitride and carbide. The at least one material of the S/D contacts 780 is pinched off in the PFET gates 204B so as to fill in a void (void left after removing block mask material 302 in PFET gates 204B) in at least one or more P-type work function metals 208 of the PFET gates 204B. A block mask material 302 filled in the void in the at least one or more P-type work function metals 208 of the PFET gates 204B prior to forming the at least one material (e.g., S/D contact liner 602) of the S/D contacts 780.

The S/D contacts 780 are formed over epitaxial S/D regions 210A and 210B. The insulating material 902 is formed as the insulator portions 980 adjacent to the S/D contacts by: recessing a S/D contact liner 602 of the S/D contacts 780 to create recessed areas 804 while not recessing a S/D contact metal 702 of the S/D contacts 780, and depositing the insulating material in the recessed areas, thereby forming insulator portions 980 adjacent to the S/D contact metal 702. The materials of the NFET gates 204A and the PFET gates 204B are recessed while recessing the S/D contact liner 602 of the S/D contacts 780. The materials of the NFET and PFET gates are recessed more than the S/D contact liner 602 of the S/D contacts 780.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   one or more N-type field effect transistor (NFET) gates and one or more P-type field effect transistor (PFET) gates;
   source and drain (S/D) contacts coupled to epitaxial S/D regions, at least one material of the S/D contacts being formed in the PFET gates;
   insulating material formed as self-aligned caps directly above the NFET gates and the PFET gates; and
   middle of the line (MOL) contacts formed above the S/D contacts, at least one of the MOL contacts comprising a downward extended portion in direct contact with one of the S/D contacts, wherein the insulating material is also formed as insulator portions in direct contact with sides of the downward extended portion and immediately above the epitaxial S/D regions.

2. The semiconductor device of claim 1, wherein the NFET gates comprise at least one or more N-type work function metals and at least one or more P-type work function metals.

3. The semiconductor device of claim 1, wherein the PFET gates comprise at least one or more P-type work function metals along with the at least one material of the S/D contacts.

4. The semiconductor device of claim 1, wherein the at least one material of the S/D contacts comprises a S/D contact liner.

5. The semiconductor device of claim 1, wherein the at least one material of the S/D contacts comprises titanium.

6. The semiconductor device of claim 1, wherein the at least one material of the S/D contacts comprises titanium and titanium nitride.

7. The semiconductor device of claim 1, wherein the at least one material of the S/D contacts comprises titanium and carbide.

8. The semiconductor device of claim 1, wherein the at least one material of the S/D contacts comprises titanium, titanium nitride, and carbide.

9. The semiconductor device of claim 1, wherein the at least one material of the S/D contacts is pinched off in the PFET gates so as to fill in a void in at least one or more P-type work function metals of the PFET gates.

10. The semiconductor device of claim 1, wherein the S/D contacts are formed over the epitaxial S/D regions.

11. The semiconductor device of claim 1, wherein the insulating material comprises nitride.

12. The semiconductor device of claim 1, wherein the insulating material comprises silicon nitride.

13. The semiconductor device of claim 1, wherein the MOL contacts comprise a MOL contact liner.

14. The semiconductor device of claim 1, wherein the MOL contacts comprise a MOL contact metal.

15. The semiconductor device of claim 1, wherein the MOL contacts comprise a MOL contact metal formed on a MOL contact liner.

16. The semiconductor device of claim 15, wherein the MOL contact liner comprises titanium.

17. The semiconductor device of claim 15, wherein the MOL contact liner comprises titanium and titanium nitride.

18. The semiconductor device of claim 15, wherein the MOL contact liner comprises titanium and cobalt.

19. The semiconductor device of claim 15, wherein the MOL contact liner comprises titanium, cobalt, and titanium nitride.

20. The semiconductor device of claim 15, wherein the MOL contact metal comprises tungsten.

\* \* \* \* \*